(12) United States Patent
Cho (10) Patent No.: US 9,305,976 B2
(45) Date of Patent: Apr. 5, 2016

(54) ELECTRONIC DEVICE INCLUDING MEMORY CELLS HAVING VARIABLE RESISTANCE CHARACTERISTICS

(71) Applicant: SK hynix Inc., Icheon (KR)

(72) Inventor: Kwang-Hee Cho, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/540,710

(22) Filed: Nov. 13, 2014

(65) Prior Publication Data

US 2016/0056211 A1 Feb. 25, 2016

(30) Foreign Application Priority Data

Aug. 19, 2014 (KR) ........................ 10-2014-0107592

(51) Int. Cl.
*H01L 45/00* (2006.01)
*H01L 27/24* (2006.01)
*G11C 13/00* (2006.01)
*G06F 12/08* (2006.01)
*G06F 13/16* (2006.01)

(52) U.S. Cl.
CPC ........ *H01L 27/2481* (2013.01); *G06F 12/0802* (2013.01); *G06F 12/084* (2013.01); *G06F 13/1673* (2013.01); *G11C 13/0011* (2013.01); *G11C 13/0023* (2013.01); *H01L 27/2418* (2013.01); *H01L 27/2427* (2013.01); *H01L 45/08* (2013.01); *H01L 45/1233* (2013.01); *H01L 45/1253* (2013.01); *G06F 2212/314* (2013.01); *G06F 2212/60* (2013.01)

(58) Field of Classification Search
CPC ............ H01L 27/2481; H01L 27/2427; H01L 27/2418; H01L 45/08; H01L 45/1233; H01L 45/1253; G11C 13/0023; G11C 13/0011; G06F 12/0802; G06F 12/084; G06F 13/1673
See application file for complete search history.

(56) References Cited

U.S. PATENT DOCUMENTS

2011/0037046 A1 2/2011 Sato et al.

*Primary Examiner* — Long Pham (57) ABSTRACT

An electronic device includes a semiconductor memory. The semiconductor memory includes a stack structure including a first electrode, a second electrode, a third electrode, an insulating layer interposed between the first electrode and the second electrode, and a variable resistance layer interposed between the second electrode and the third electrode; and a selection element layer disposed over at least a part of a sidewall of the stack structure.

18 Claims, 8 Drawing Sheets

ELECTRONIC DEVICE INCLUDING MEMORY CELLS HAVING VARIABLE RESISTANCE CHARACTERISTICS

CROSS-REFERENCE TO RELATED APPLICATION

The present application claims priority to Korean Patent Application No. 10-2014-0107592, entitled "ELECTRONIC DEVICE" and filed on Aug. 19, 2014, which is incorporated by reference herein in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device can provide a memory cell having an improved operating characteristic by preventing a sidewall damage of a selection element layer and improve a degree of integration thereof.

In an embodiment, an electronic device includes a semiconductor memory unit that comprises a stack structure including a first electrode, a second electrode, a third electrode, an insulating layer interposed between the first electrode and the second electrode, and a variable resistance layer interposed between the second electrode and the third electrode; and a selection element layer disposed over at least a part of a sidewall of the stack structure so that the selection element layer selectively couples the first electrode and the second electrode.

Embodiments of the above device may include one or more of the following.

The selection element layer includes any one of an OTS (Ovonic Threshold Switching) material layer, an MIEC (Mixed Ionic Electronic Conducting) material layer, an MIT (Metal Insulator Transition) material layer, and a tunneling insulating layer. The selection element layer has a band gap smaller than that of the insulating layer. The selection element layer switches between an insulating state and a conductive state according to a level of a voltage or current applied to the selection element layer. The selection element layer includes an operating portion and a remaining portion, and the operating portion of the selection element layer is adjacent to the insulating layer and selectively couples the first electrode and the second electrode, and the operating portion has a resistance state different from that of the remaining portion of the selection element layer when a voltage equal to or higher than a threshold voltage is applied to the selection element layer. The operating portion of the selection element layer is spaced apart from an outer wall of the selection element layer such that the operating portion does not include a portion damaged by an etching process. A resistance switching operation of the variable resistance layer is performed in a part of the variable resistance layer. A conductive filament electrically connecting the second electrode and the third electrode is generated in an inner portion of the variable resistance layer, and the inner portion of the variable resistance layer is sufficiently spaced apart from the sidewall of the stack structure so that the inner portion does not include a portion damaged by an etching process. The semiconductor memory unit comprises: a plurality of memory cells each of which includes the stack structure and the selection element layer. The semiconductor memory unit further comprises first lines extending in a first direction; and second lines extending in a second direction crossing the first direction, and wherein the plurality of memory cells are disposed at intersections of the first lines and the second lines and interposed between the first lines and the second lines. A cross-section of the selection element layer has a sidewall spacer shape. The selection element layer is disposed over sidewalls of the first electrode, the insulating layer and the second electrode. The stack structure corresponds to a first stack structure, the device further comprising a second stack structure that has substantially the same configuration as the first stack structure, the selection element layer is further disposed over a bottom surface of a space between the first and second stack structures.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is a part of the memory or the buffer memory in the memory system.

These and other aspects, implementations and associated advantages are described will become apparent in view of the drawings and the description of embodiments provided herein, which are intended to provide further explanation of the invention as claimed.

DETAILED DESCRIPTION

Various embodiments of the present disclosure will be described below with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence in which the layers are arranged reflects a particular implementation of an embodiment and a different relative positioning relationship or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, but may also represent a structure where one or more other intermediate layers exist between the first layer and the second layer or the substrate.

Prior to describing implementations, a memory cell in accordance with a comparative example will be described with reference to FIG. 1.

Figure 1:
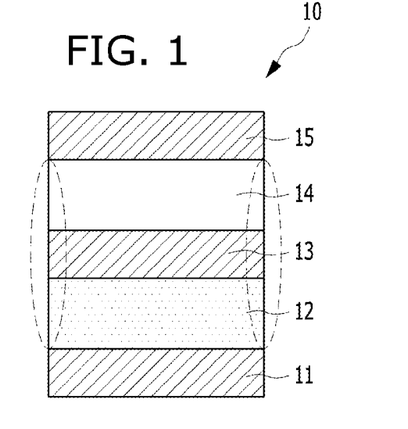
FIG. 1 is a cross-sectional view illustrating a memory cell in accordance with a comparative example.

FIG. 1 is a cross-sectional view illustrating a memory cell in accordance with a comparative example.

Referring to FIG. 1, the memory cell 10 of the comparative example may include a first electrode 11, a second electrode 13, a third electrode 15, a selection element layer 12 interposed between the first electrode 11 and the second electrode 13, and a variable resistance layer 14 interposed between the second electrode 13 and the third electrode 15.

The selection element layer 12 may switch between a conductive state and an insulating state according to a voltage or current supplied thereto through the first and second electrodes 11 and 13, thereby controlling access to the variable resistance layer 14.

The variable resistance layer 14 may switch between different resistance states according to a voltage or current supplied thereto through the second and third electrodes 13 and 15, thereby storing data. In an implementation, the variable resistance layer 14 may store data '1' corresponding to a logic high value when the variable resistance layer 14 is in a low resistance state, and the variable resistance layer 14 may store data '0' corresponding to a logic low value when the variable resistance layer 14 is in a high resistance state. However, implementations are not limited thereto.

The memory cell 10 may be formed by sequentially depositing materials for forming the first electrode 11, the selection element layer 12, the second electrode 13, the variable resistance layer 14 and the third electrode 15 over a substrate (not shown), and then selectively etching the deposited materials.

However, during the above etching process, damage may occur at a portion (indicated by dotted lines in FIG. 1) of a sidewall of a stack structure including the first electrode 11, the selection element layer 12, the second electrode 13, the variable resistance layer 14, and the third electrode 15. A characteristic of the memory cell 10 may be deteriorated as a result of the damage.

Here, a part of the variable resistance layer 14 may be used to perform a switching operation of the variable resistance layer 14 by which the resistance state of the variable resistance layer 14 is changed. That is, a localized switching operation may be performed in the part of the variable resistance layer 14. The resistance state of the variable resistance layer 14 may be changed as a conductive filament, which electrically connects the second electrode 13 and the third electrode 15, is generated or disappears in an inner portion of the variable resistance layer 14. In this case, when the inner portion is sufficiently spaced apart from the sidewall of the stack structure, the switching operation of the variable resistance layer 14 may be less affected by etching damage.

On the other hand, substantially the whole body of the selection element layer 12 may be used during its switching operation. In an implementation, when the selection element layer 12 is formed of a chalcogenide-based material having an OTS (Ovonic Threshold Switching) characteristic, a bulk operation may be performed. During the bulk operation, a damaged portion, including a sidewall of the selection element layer 12, may be used, and thus the operation of the selection element layer 12 may be more affected by etching damage compared to the variable resistance layer 14, which performs a localized switching operation. As a result, a characteristic of the selection element layer 12 may be deteriorated. In order to substantially maintain the characteristic of the selection element layer 12, a width of the selection element layer 12 may be increased to compensate for the damaged portion. However, the increase in the width of the selection element layer 12 may lower the degree of integration of a semiconductor device including the memory cell 10.

In following implementations, a semiconductor device in which an operating characteristic of a memory cell is improved by reducing damage to a sidewall of a selection element layer while the degree of integration is increased, and a method for fabricating the same will be provided.

Figure 2A:
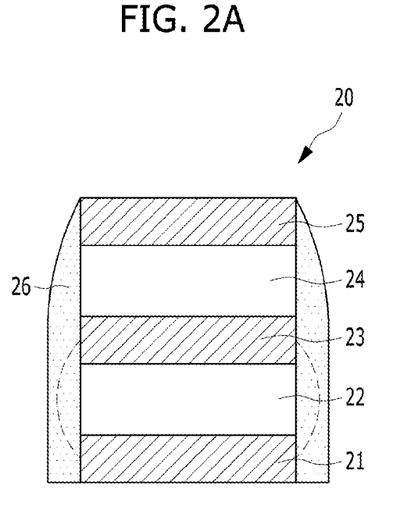
FIG. 2A is a cross-sectional view illustrating a memory cell in accordance with an implementation.
Figure 2B:
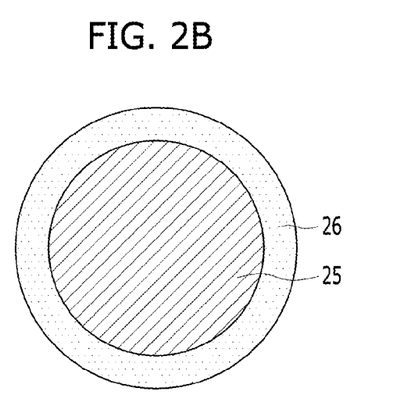
FIG. 2B is a plan view of the memory cell of FIG. 2A.

FIG. 2A is a cross-sectional view illustrating a memory cell in accordance with an implementation, and FIG. 2B is a plan view of the memory cell of FIG. 2A.

Referring to FIGS. 2A and 2B, a memory cell 20 of an implementation may include a stack structure of a first electrode 21, a second electrode 23, a third electrode 25, an insulating layer 22 interposed between the first electrode 21 and the second electrode 23, and a variable resistance layer 24 interposed between the second electrode 23 and the third electrode 25. The memory cell 20 may further include a selection element layer 26 disposed over a sidewall of the stack structure.

The first electrode 21, the second electrode 23, and the third electrode 25 may be formed of one or more conductive materials, e.g., a metal such as W, Al, or Ti, a metal nitride such as TiN, a semiconductor material doped with an impurity element, or a combination thereof.

The insulating layer 22 may be formed of a material which can stably maintain an insulating characteristic regardless of the level of a voltage or current supplied to the insulating layer 22 through the first electrode 21 and the second electrode 23. That is, the insulating layer 22 may block a current flow between the first electrode 21 and the second electrode 23. The insulating layer 22 may be formed of one or more insulating materials, e.g., a silicon oxide, a silicon nitride, a silicon oxynitride or a combination thereof.

The variable resistance layer 24 may have two or more resistance states according to the levels of a voltage or current supplied thereto through the second electrode 23 and the third electrode 25 so as to store data having one or more bits. Here, a resistance value of the variable resistance layer 24 may change as a conductive filament is locally generated or disappears in the variable resistance layer 24. In an implementation, the variable resistance layer 24 may include an oxygen-deficient metal oxide containing oxygen vacancies. The oxygen-deficient metal oxide may include a material that is deficient in oxygen compared to a material that satisfies a stoichiometric ratio. The oxygen-deficient metal oxide may include $TiO_x$, where x is smaller than 2, or $TaO_y$, where y is smaller than 2.5.

In an implementation, when a conductive filament is generated by movement of the oxygen vacancies, the variable resistance layer 24 may be in a low resistance state and store data '1' corresponding to a logic high value. On the other hand, when the conductive filament disappears, the variable resistance layer 24 may be in a high resistance state and store data '0' corresponding to a logic low value. When the variable resistance layer 24 switches between the low resistance state and the high resistance state, since the conductive filament is generated and disappears in an inner portion of the variable resistance layer 24, a switching operation of the variable resistance layer 24 may be less affected by sidewall damage resulting from an etching process performed to form the stack structure.

In an implementation, the variable resistance layer 24 may have a single-layered structure or a multi-layered structure including one or more of various variable resistance materials that are used in an RRAM, a PRAM, an FRAM, an MRAM, etc.

The stack structure of the first electrode 21, the insulating layer 22, the second electrode 23, the variable resistance layer 24 and the third electrode 25 may be an island type in a plan view, e.g., may be formed so that they are discontinuous from each other. However, implementations are not limited thereto. In other implementations, the stack structure may have various configurations other than an island type.

The selection element layer 26 may control access to the variable resistance layer 24. The selection element layer 26 may be formed of a material which can substantially block a current flow through the selection element layer 26, when a voltage smaller than a threshold voltage is applied to the selection element layer 26. The material may allow a current to flow when a voltage that is equal to or higher than the threshold voltage is applied to the selection element layer 26. The selection element layer 26 may have a band gap smaller than that of the insulating layer 22. Thus, when a voltage, which is equal to or higher than the threshold voltage corresponding to the band gap, is applied thereto, the selection element layer 26 switches to a conductive state while the insulating layer 22 maintains its insulating state.

In an implementation, the selection element layer 26 may be formed of a chalcogenide-based material used in an OTS device, e.g., an alloy of Ge, Sb and Te. In a switching operation of the selection element layer 26, the crystallinity of a portion of the selection element layer 26 that is adjacent to the insulating layer 22 and couples the first electrode 21 and the second electrode 23 may be changed. Depending on the crystallinity of the portion of the selection element layer 26, a current that electrically couples the first electrode 21 and the second electrode 23 may flow through the portion of the selection element layer 26. In FIG. 2A, the portion of the selection element layer 26 is indicated by dotted lines. Hereinafter, the portion of the selection element layer 26 having a variable crystallinity may be referred to as an operating portion of the selection element layer 26. When the operating portion of the selection element layer 26 is in an amorphous state, the operating portion may be in a high resistance state and thus have an insulating characteristic. On the other hand, when the operating portion of the selection element layer 26 is in a crystalline state, the operating portion may be in a low resistance state and thus have a conductive characteristic. That is, when the operating portion of the selection element layer 26 is in a crystalline state, a current flows through the operating portion to electrically couple the first electrode 21 and the second electrode 23.

As described above, a switching operation of the selection element layer 26 is mainly performed through the operating portion. Therefore, when a voltage, which is equal to or higher than the threshold voltage, is applied to the selection element layer 26, the operating portion may change to a low resistance state while the remaining portion of the selection element layer 26 maintains its resistance state. That is, a resistance value of the operating portion becomes different from a resistance value of the remaining portion.

In another implementation, the selection element layer 26 may be formed of a chalcogenide-based material including a metal used in an MIEC (Mixed Ionic Electronic Conducting) device, e.g., Cu-doped GeSeTe, Al-doped GeSeTe, or the like. In this case, the operating portion of the selection element layer 26 may have an insulating characteristic or a conductive characteristic according to the degree of movement of metal ions to an interface between the first electrode 21 or the second electrode 23 and the selection element layer 26.

In still another implementation, the selection element layer 26 may be formed of a metal oxide used in an MIT (Metal Insulator Transition) device, e.g., $NbO_2$, $VO_2$, or the like. In this case, the operating portion of the selection element layer 26 may have an insulating characteristic or a conductive characteristic.

In still another implementation, the selection element layer 26 may be formed of a tunneling insulating layer used in an MIM (Metal Insulator Metal) device. The tunneling insulating layer may have a single-layer structure or a multi-layer structure including $TiO_2$, $Ta_2O_5$ or a combination thereof. In this case, the operating portion of the selection element layer 26 may have an insulating characteristic or a conductive characteristic according to the tunneling of electrons.

However, implementations are not limited thereto. Various other materials may be used as the selection element layer 26 as long as they have the characteristic of switching between an insulating state and a conductive state according to a voltage or current supplied thereto.

In the implementation shown in FIG. 2A, the selection element layer 26 is disposed over substantially the whole surface of a sidewall of the stack structure. However, in another implementation, the selection element layer 26 may be disposed over a part of the sidewall of the stack structure. For example, the selection element layer 26 may be disposed over sidewalls of the first electrode 21, the insulating layer 22 and the second electrode 23.

When the selection element layer 26 of the memory cell 20 is turned on, that is, when the operating portion of the selection element layer 26 has the conductive characteristic, a current flows through the operating portion of the selection element layer 26 so that the first electrode 21 and the second electrode 23 are electrically coupled to each other through the operating portion. As a result, it is possible to access the variable resistance layer 24. Here, since the insulating layer 22 has a stable insulating characteristic, it blocks a current from flowing between the first electrode 21 and the second electrode 23. Therefore, the current flowing between the first electrode 21 and the second electrode 23 is generated only through the operating portion of the selection element layer 26.

The aforementioned memory cell 20 may have following aspects.

Since the selection element layer 26 is formed after the stack structure is formed, the selection element layer 26 may not be damaged in an etching process used to form the stack structure. Even if the selection element layer 26 is damaged in a subsequent etching process, since the damage would occur at an outer sidewall of the selection element layer 26, the operating portion may not be affected by the damage as long as the operating portion is sufficiently spaced apart from the outer sidewall of the selection element layer 26.

Therefore, the selection element layer 26 can be formed of a material which performs a bulk operation, e.g., an OTS material. Also, even when such a material is used, since the selection element layer 26 does not substantially increase the area it occupies in a semiconductor device, it is possible to increase the degree of integration of the semiconductor device compared to a semiconductor device including the selection element layer 12 (see FIG. 1).

A semiconductor device in accordance with an implementation includes a cell array including a plurality of memory cells 20. The plurality of memory cells 20 may be arranged in various manners to form the cell array. A semiconductor device in accordance with an implementation will be described with reference to FIGS. 3A and 3B.

Figure 3A:
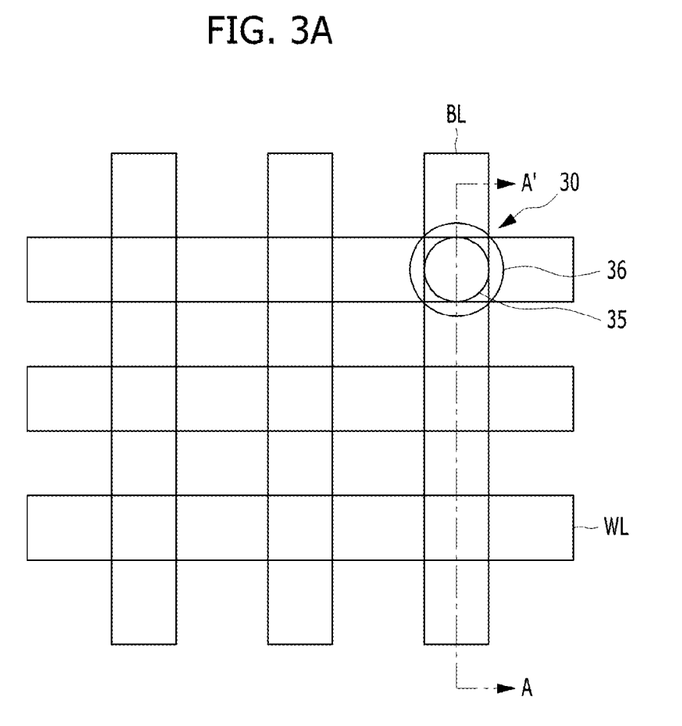
FIG. 3A is a plan view illustrating a semiconductor device in accordance with an implementation.
Figure 3B:
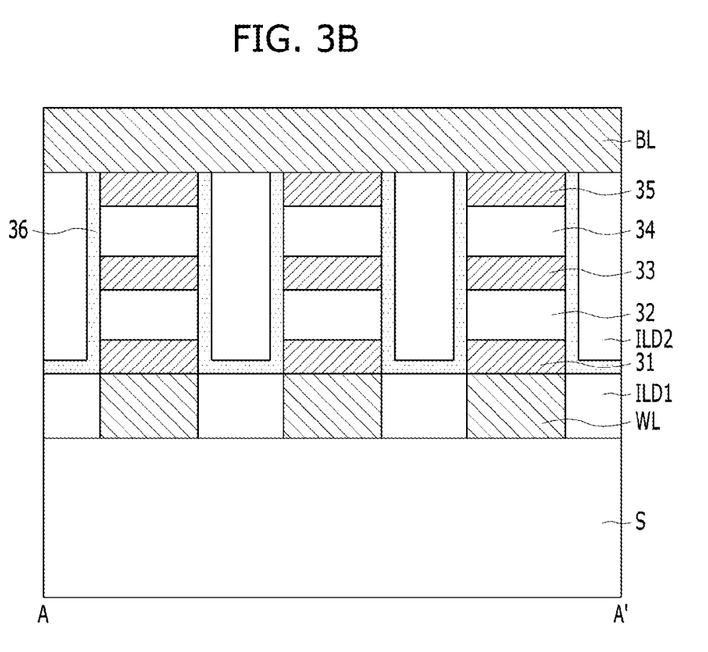
FIG. 3B is a cross-sectional view taken along a line A-A' of FIG. 3A.

FIG. 3A is a plan view illustrating a semiconductor device in accordance with an implementation, and FIG. 3B is a cross-sectional view taken along a line A-A' of FIG. 3A.

Referring to FIGS. 3A and 3B, a semiconductor device may include a plurality of word lines WL formed over a substrate S and extending in a first direction, a plurality of bit lines BL formed over the word lines WL and extending in a second direction crossing the first direction, and memory cells 30 interposed between the word lines WL and the bit lines BL and disposed at intersections of the word lines WL and the bit lines BL.

The word lines WL and the bit lines BL may supply a voltage or current to the memory cells 30. The word line WL and the bit line BL may have a single-layer structure or a multi-layer structure including one or more conductive materials, e.g., a metal, a metal nitride, etc. Positions of the word lines WL and the bit lines BL may be reversed such that the word lines WL are disposed over the bit lines BL. A space between the word lines WL may be filled with a first interlayer dielectric layer ILD1, and a space between the bit lines BL may be filled with another interlayer dielectric layer (not shown).

Each of the memory cells 30 may have substantially the same stack structure as the memory cell 20 of FIGS. 2A and 2B. That is, each of the memory cells 30 may include a stack structure of a first electrode 31, an insulating layer 32, a second electrode 33, a variable resistance layer 34 and a third electrode 35, and a selection element layer 36 disposed over a sidewall of the stack structure. In this implementation, the selection element layer 36 may be disposed over both the sidewall of the stack structure and the bottom surface of a space between the stack structure and an adjacent stack structure, e.g., over the top surface of the first interlayer dielectric layer ILD1. However, other implementations are also possible.

In another implementation, the selection element layer 36 has a cross-section similar to that of a sidewall spacer as shown in FIG. 2A. That is, the selection element layer 36 may not be disposed over the bottom surface of the space between the two adjacent stack structures. As used in this disclosure, the term "sidewall spacer shape" and similar terms refer to a configuration where, in a cross-sectional view, a structure has one sidewall with at least one curved portion and an opposing sidewall that is substantially vertical with respect to a substrate. However, one of skill in the art will understand that such references are merely for convenience of description and are not intended to limiting. A shape of the selection element layer 36 may be changed in various manners as long as the selection element layer 36 is formed over at least a part of the sidewall of the stack structure to electrically couple the first electrode 31 and the second electrode 33 through an operating portion of the selection element layer 36. In an implementation, as shown in FIG. 2A or FIG. 3B, the selection element layer 36 fully covers sidewalls of the first electrode 31, the insulating layer 32 and the second electrode 33. In another implementation, the selection element layer 36 may cover part of the sidewalls of the first electrode 31 and the second electrode 33 while fully covering the sidewall of the insulating layer 32.

A space between the memory cells 30 may be filled with a second interlayer dielectric layer ILD2.

In other implementation, the first electrode 31 may be omitted. In this case, the word lines WL may perform a function of the first electrode 31. Likewise, the third electrode 35 may be omitted. In this case, the bit lines BL may perform a function of the third electrode 35.

Figure 4:
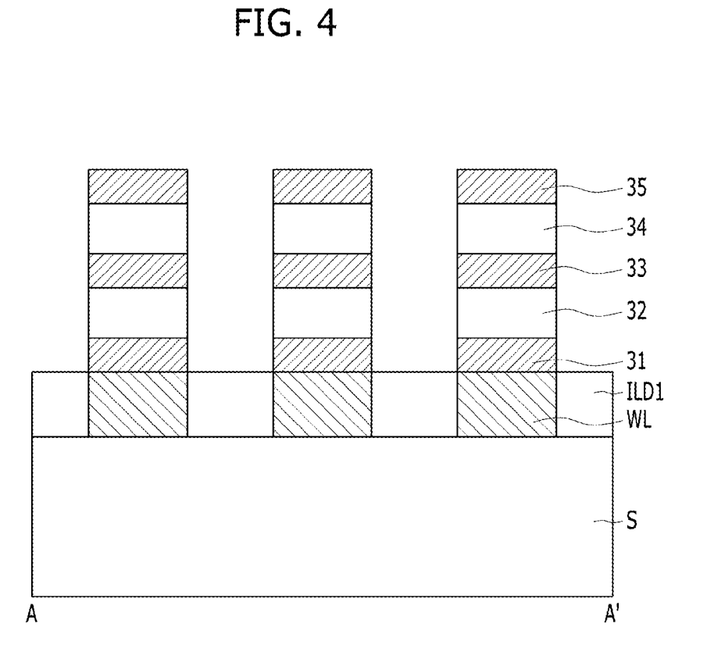
FIGS. 4 to 6 are cross-sectional views showing intermediate processing steps of fabricating the semiconductor device of FIGS. 3A and 3B.
Figure 5:
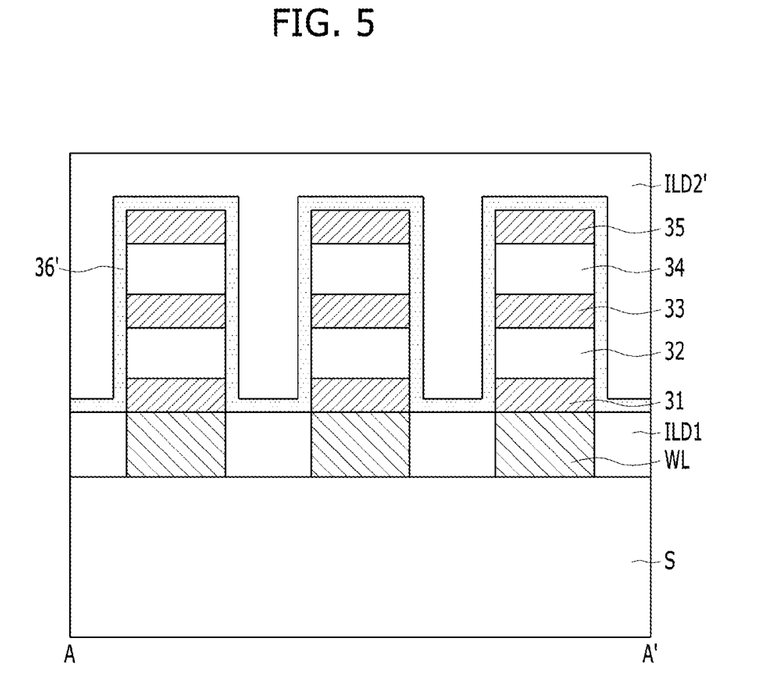
Figure 6:
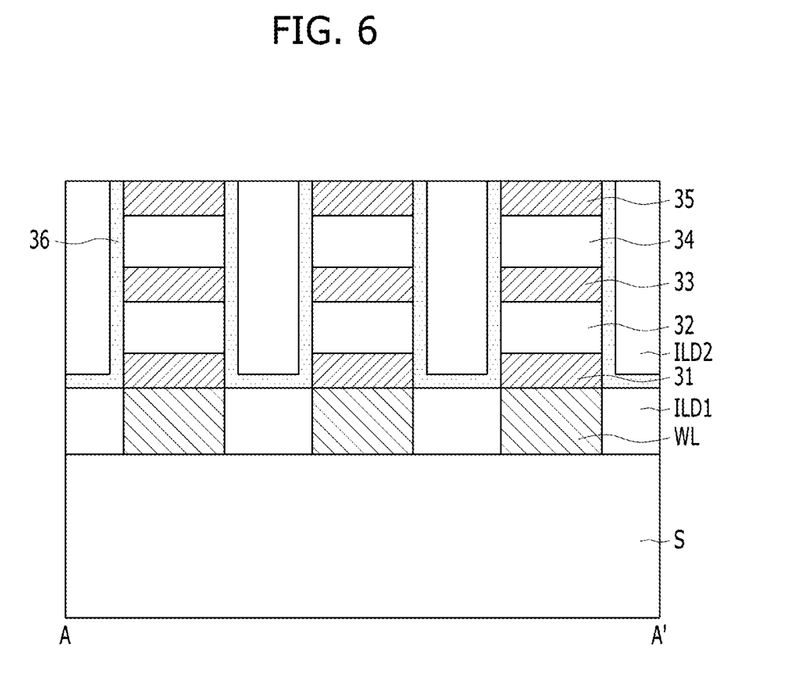

FIGS. 4 to 6 are cross-sectional views showing intermediate processing steps of fabricating the semiconductor device of FIGS. 3A and 3B.

Referring to FIG. 4, the word lines WL may be formed by depositing a conductive material over the substrate S in which elements (not shown) are formed, and selectively etching the conductive material.

Then, the first interlayer dielectric layer ILD1 may be formed by filling the space between the word lines WL with an insulating material.

Then, the stack structure of the first electrode 31, the insulating layer 32, the second electrode 33, the variable resistance layer 34 and the third electrode 35 may be formed by sequentially depositing a first conductive material, an insulating material, a second conductive material, a variable resistance material and a third conductive material, and selectively etching them. In an implementation, an anisotropic etching process, such as plasma etching (PE), reactive ion etching (RIE), high-density plasma etching (HDPE), or the like, is performed in a direction that is substantially vertical with respect to the top surface of the substrate S to form the stack structure.

Referring to FIG. 5, a selection element material layer 36' may be formed along a profile surface of a resultant structure of FIG. 4. The selection element material layer 36' may be formed using a deposition method which has an excellent step coverage characteristic.

Then, a second interlayer dielectric material layer ILD2' may be formed to cover the selection element material layer 36' and fill a space between the stack structure and an adjacent stack structure. The second interlayer dielectric material layer ILD2' may have a thickness sufficient to entirely fill the space between the two adjacent stack structures.

Meanwhile, although not shown in FIG. 5, a selection element layer having a sidewall spacer shape may be formed over the sidewall of the stack structure by performing a blanket-etching process on the selection element material layer 36'. In an implementation, after conformally depositing the selection element material layer 36' along the profile surface of the resultant structure of FIG. 4, the selection element material layer 36' is etched back in a substantially vertical direction using a highly anisotropic etching method (e.g., PE, RIE, HDPE, or the like) until the selection element material layer 36' remains only on the sidewall of the stack structure. In this implementation, there may be damage to a portion of an outer wall of the selection element layer when the selection element material layer 36' is etched back. However, as described above, since an operating portion of the selection element layer may be spaced apart from the outer wall of the selection element layer, a switching operation of the selection element layer may not be affected by the damage.

Referring to FIG. 6, the resultant structure of FIG. 5 may be planarized until a top surface of the third electrode 35 is exposed. As a result, the selection element layer 36 may be formed along the sidewall of the stack structure and the bottom surface of the space between the adjacent stack structures. The planarization process may include a CMP (Chemical Mechanical Polishing) process.

Then, referring again to FIG. 3B, the bit lines BL may be formed to be coupled to the third electrode 35 by depositing a conductive material over a resultant structure of FIG. 6 and patterning the conductive material.

The above and other memory circuits or semiconductor devices based on the disclosed technology can be used in a range of devices or systems. FIGS. 7-11 provide some examples of devices or systems that can implement a memory circuit in accordance with an embodiment disclosed herein.

Figure 7:
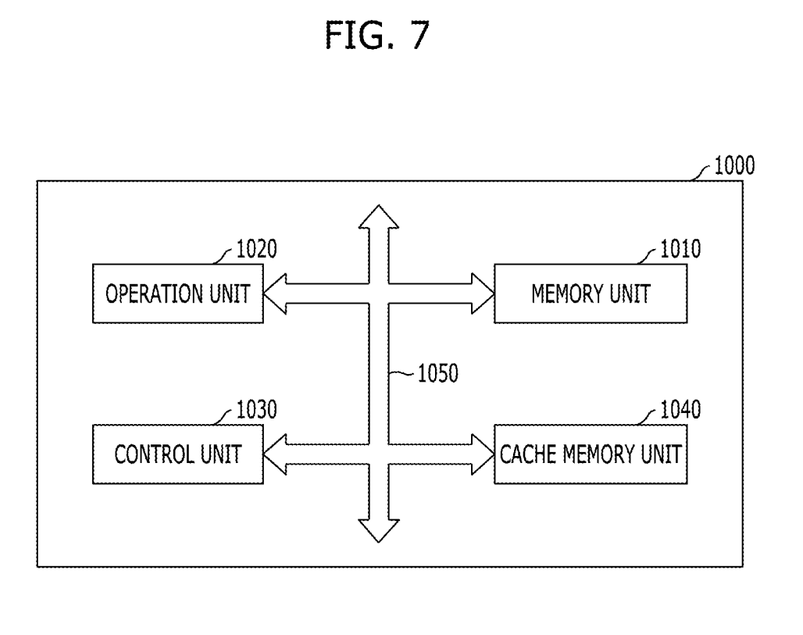
FIG. 7 illustrates a microprocessor implementing memory circuitry based on the disclosed technology.

FIG. 7 illustrates a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with embodiments. For example, the memory unit 1010 may include a stack structure including a first electrode, a second electrode, a third electrode, an insulating layer interposed between the first electrode and the second electrode, and a variable resistance layer interposed between the second electrode and the third electrode; and a selection element layer formed over a whole or a part of a sidewall of the stack structure. Through this, a degree of integration of the memory unit 1010 may be increased and performance characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
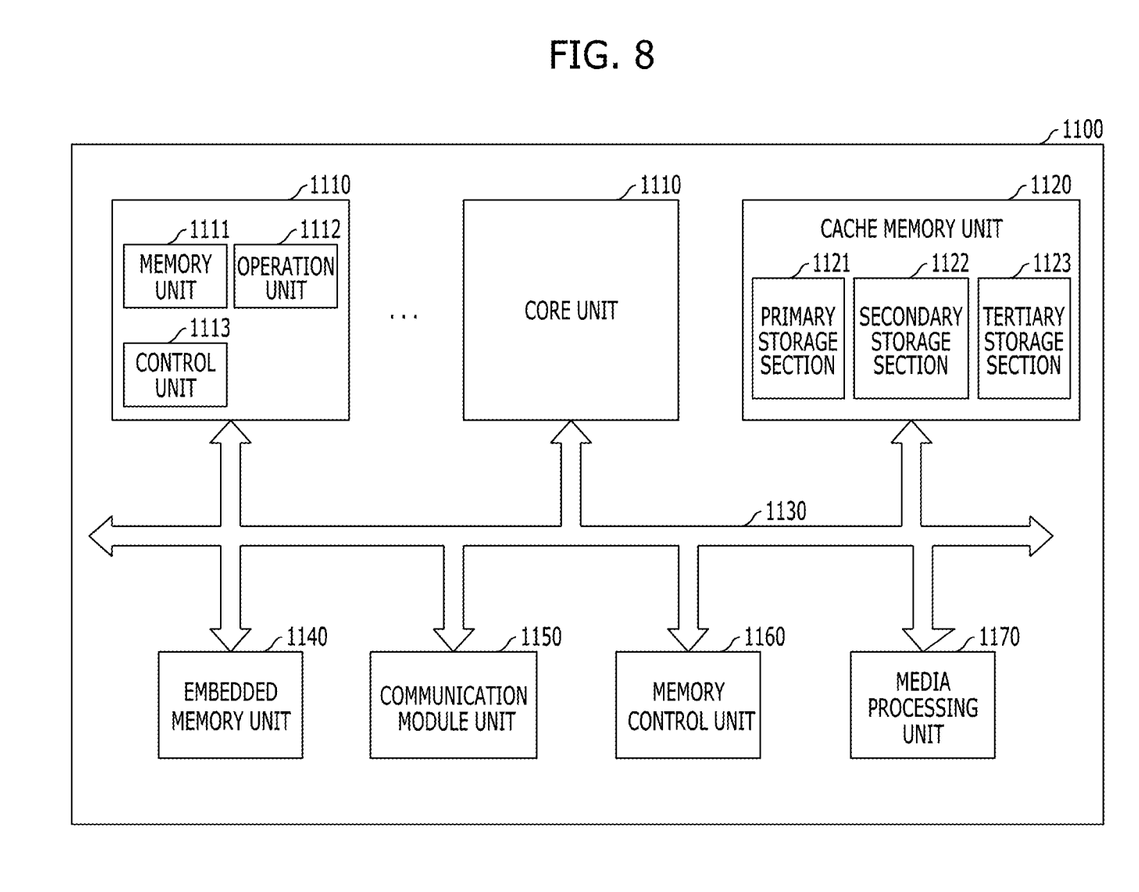
FIG. 8 illustrates a processor implementing memory circuitry based on the disclosed technology.

FIG. 8 illustrates a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this embodiment is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a stack structure including a first electrode, a second electrode, a third electrode, an insulating layer interposed between the first electrode and the second electrode, and a variable resistance layer interposed between the second electrode and the third electrode; and a selection element layer formed over a whole or a part of a sidewall of the stack structure. Through this, a degree of integration of the cache memory unit 1120 may be increased and performance characteristics of the cache memory unit 1120 may be improved. As a consequence, performance characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another embodiment, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
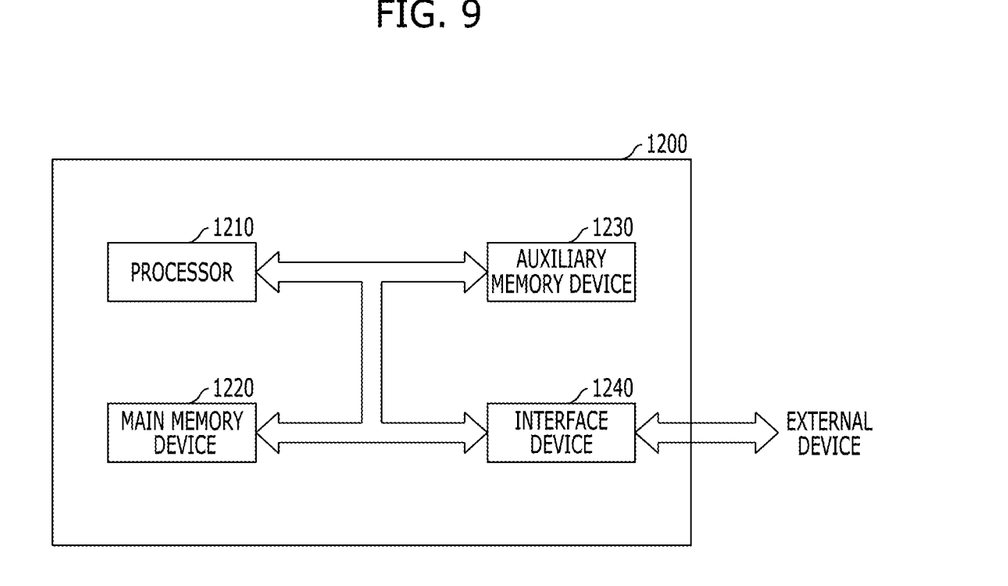
FIG. 9 illustrates a system implementing memory circuitry based on the disclosed technology.

FIG. 9 illustrates a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the embodiments. For example, the main memory device 1220 may include a stack structure including a first electrode, a second electrode, a third electrode, an insulating layer interposed between the first electrode and the second electrode, and a variable resistance layer interposed between the second electrode and the third electrode; and a selection element layer formed over a whole or a part of a sidewall of the stack structure. Through this, a degree of integration of the main memory device 1220 may be increased and performance characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the embodiments, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include a stack structure including a first electrode, a second electrode, a third electrode, an insulating layer interposed between the first electrode and the second electrode, and a variable resistance layer interposed between the second electrode and the third electrode; and a selection element layer formed over a whole or a part of a sidewall of the stack structure. Through this, a degree of integration of the auxiliary memory device 1230 may be increased and performance characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the embodiments, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
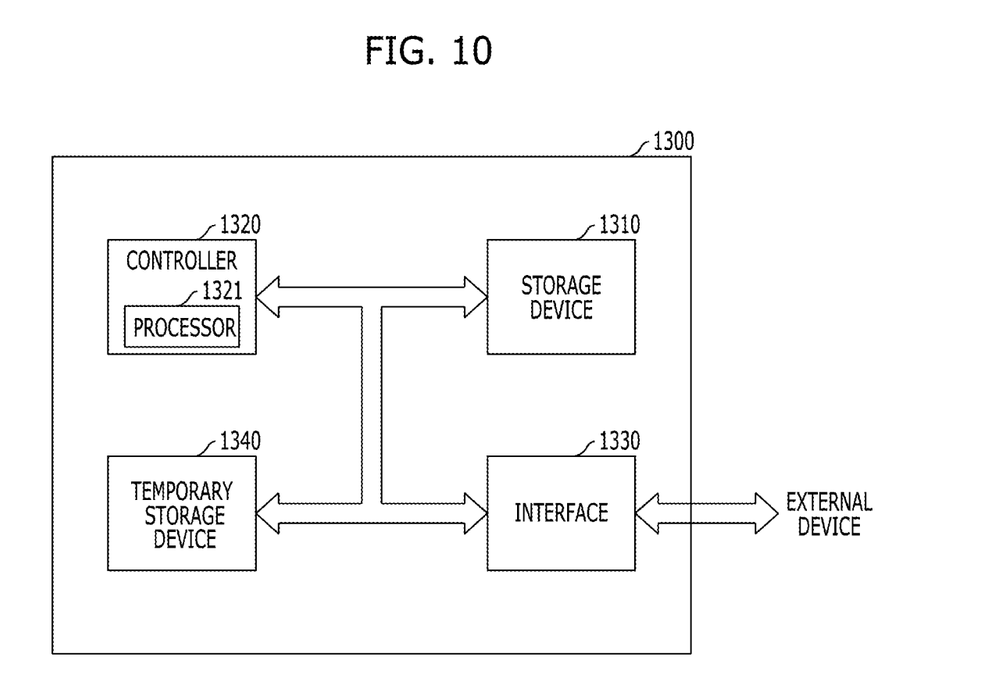
FIG. 10 illustrates a data storage system implementing memory circuitry based on the disclosed technology.

FIG. 10 illustrates a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the embodiments. The temporary storage device 1340 may include a stack structure including a first electrode, a second electrode, a third electrode, an insulating layer interposed between the first electrode and the second electrode, and a variable resistance layer interposed between the second electrode and the third electrode; and a selection element layer formed over a whole or a part of a sidewall of the stack structure. Through this, a degree of integration of the temporary storage device 1340 may be increased and performance characteristics of the temporary storage device 1340 may be improved. As a consequence, performance characteristics of the data storage system 1300 may be improved.

Figure 11:
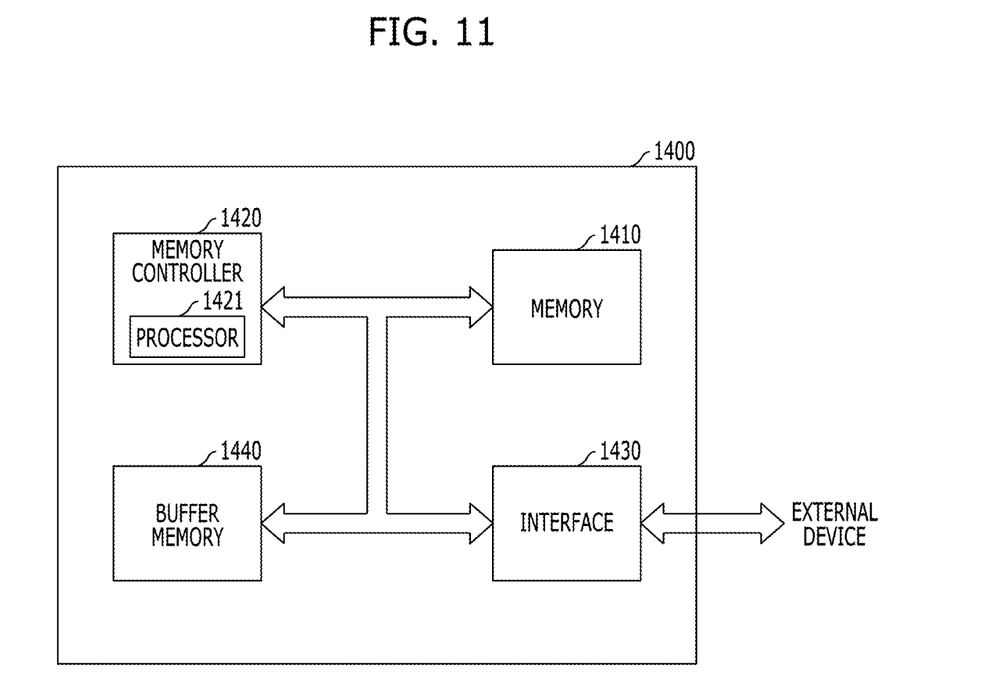
FIG. 11 illustrates a memory system implementing memory circuitry based on the disclosed technology.

FIG. 11 illustrates a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the embodiments. For example, the memory 1410 may include a stack structure including a first electrode, a second electrode, a third electrode, an insulating layer interposed between the first electrode and the second electrode, and a variable resistance layer interposed between the second electrode and the third electrode; and a selection element layer formed over a whole or a part of a sidewall of the stack structure. Through this, a degree of integration of the memory 1410 may be increased and performance characteristics of the memory 1410 may be improved. As a consequence, performance characteristics of the memory system 1400 may be improved.

Also, the memory 1410 according to this embodiment may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this embodiment may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the embodiments. The buffer memory 1440 may include a stack structure including a first electrode, a second electrode, a third electrode, an insulating layer interposed between the first electrode and the second electrode, and a variable resistance layer interposed between the second electrode and the third electrode; and a selection element layer formed over a whole or a part of a sidewall of the stack structure. Through this, a degree of integration of the buffer memory 1440 may be increased and performance characteristics of the buffer memory 1440 may be improved. As a consequence, performance characteristics of the memory system 1400 may be improved.

Moreover, the buffer memory 1440 according to this embodiment may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the embodiments, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on a memory device in accordance with an embodiment disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments.

Only a few embodiments and examples are described. Other embodiments, enhancements and variations can be made based on what is described and illustrated in this disclosure.

What is claimed is:

1. An electronic device comprising a semiconductor memory unit, the semiconductor memory unit comprising:
a stack structure including a first electrode, a second electrode, a third electrode, an insulating layer interposed between the first electrode and the second electrode, and a variable resistance layer interposed between the second electrode and the third electrode; and
a selection element layer disposed over at least a part of a sidewall of the stack structure so that the selection element layer selectively couples the first electrode and the second electrode.

2. The electronic device according to claim 1, wherein the selection element layer includes any one of an OTS (Ovonic Threshold Switching) material layer, an MIEC (Mixed Ionic Electronic Conducting) material layer, an MIT (Metal Insulator Transition) material layer, and a tunneling insulating layer.

3. The electronic device according to claim 1, wherein the selection element layer has a band gap smaller than that of the insulating layer.

4. The electronic device according to claim 1, wherein the selection element layer switches between an insulating state and a conductive state according to a level of a voltage or current applied to the selection element layer.

5. The electronic device according to claim 1, wherein the selection element layer includes an operating portion and a remaining portion, wherein the operating portion of the selection element layer is adjacent to the insulating layer and selectively couples the first electrode and the second electrode, and wherein the operating portion has a resistance state different from that of the remaining portion of the selection element layer when a voltage equal to or higher than a threshold voltage is applied to the selection element layer.

6. The electronic device according to claim 5, wherein the operating portion of the selection element layer is spaced apart from an outer wall of the selection element layer such that the operating portion does not include a portion damaged by an etching process.

7. The electronic device according to claim 1, wherein a resistance switching operation of the variable resistance layer is performed in a part of the variable resistance layer.

8. The electronic device according to claim 1, wherein a conductive filament electrically connecting the second electrode and the third electrode is generated in an inner portion of the variable resistance layer, and wherein the inner portion of the variable resistance layer is sufficiently spaced apart from the sidewall of the stack structure so that the inner portion does not include a portion damaged by an etching process.

9. The electronic device according to claim 1, wherein the semiconductor memory unit comprises a plurality of memory cells each of which includes the stack structure and the selection element layer.

10. The electronic device according to claim 9, wherein the semiconductor memory unit further comprises:

first lines extending in a first direction; and
second lines extending in a second direction crossing the first direction, and
wherein the plurality of memory cells are disposed at intersections of the first lines and the second lines and interposed between the first lines and the second lines.

11. The electronic device according to claim 1, further comprising a microprocessor which includes:

a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit is a part of the memory unit in the microprocessor.

12. The electronic device according to claim 1, further comprising a processor which includes:

a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit is a part of the cache memory unit in the processor.

13. The electronic device according to claim 1, further comprising a processing system which includes:

a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory unit is a part of the auxiliary memory device or the main memory device in the processing system.

14. The electronic device according to claim 1, further comprising a data storage system which includes:

a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit is a part of the storage device or the temporary storage device in the data storage system.

15. The electronic device according to claim 1, further comprising a memory system which includes:

a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit is a part of the memory or the buffer memory in the memory system.

16. The electronic device according to claim 1, wherein a cross-section of the selection element layer has a sidewall spacer shape.

17. The electronic device according to claim 1, wherein the selection element layer is disposed over sidewalls of the first electrode, the insulating layer and the second electrode.

18. The electronic device according to claim 1, wherein the stack structure corresponds to a first stack structure, the device further comprising:

a second stack structure that has substantially the same configuration as the first stack structure,
wherein the selection element layer is further disposed over a bottom surface of a space between the first and second stack structures.

* * * * *